United States Patent
Chong

(10) Patent No.: US 9,438,211 B1
(45) Date of Patent: Sep. 6, 2016

(54) HIGH SPEED LATCH AND METHOD

(71) Applicant: Huawei Technologies Co., Ltd., Shenzhen (CN)

(72) Inventor: Euhan Chong, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/801,473

(22) Filed: Jul. 16, 2015

(51) Int. Cl.
*G11C 7/00* (2006.01)
*H03F 3/45* (2006.01)
*H03K 3/356* (2006.01)
*H03K 3/012* (2006.01)

(52) U.S. Cl.
CPC ........ *H03K 3/356104* (2013.01); *H03K 3/012* (2013.01)

(58) Field of Classification Search
CPC ...... H03K 3/0233; H03K 5/22; H03M 1/361
USPC ........... 327/55, 52, 57, 51, 65, 50, 208, 212, 327/217, 218
See application file for complete search history.

(56) References Cited

U.S. PATENT DOCUMENTS

| | | | |
|---|---|---|---|
| 2004/0027185 A1 | 2/2004 | Fiedler | |
| 2005/0237096 A1* | 10/2005 | Shi | H03K 3/356139 327/199 |
| 2011/0006828 A1 | 1/2011 | Chen et al. | |
| 2014/0132437 A1* | 5/2014 | Danjo | H03M 1/3661 341/159 |

FOREIGN PATENT DOCUMENTS

| | | |
|---|---|---|
| CN | 1845460 A | 10/2006 |
| CN | 201854264 U | 6/2011 |
| CN | 103973274 A | 8/2014 |
| CN | 104124971 A | 10/2014 |
| CN | 104579246 A | 4/2015 |

OTHER PUBLICATIONS

Kobayashi, T. et al., "A Current-Controlled Latch Sense Amplifier and a Static Power-Saving Input Buffer for Low-Power Architecture," IEEE Journal of Solid-State Circuits, vol. 28, No. 4, Apr. 1993, 5 pages.

Schinkel, D. et al., "A Double-Tail Latch-Type Voltage Sense Amplifier with 18 ps Setup+Hold Time," IEEE International Solid-State Circuits Conference, ISSCC 2007, Session 17, Analog Techniques and PLLs, 17.7, Feb. 11-15, 2007, 3 pages.

* cited by examiner

*Primary Examiner* — Lincoln Donovan
*Assistant Examiner* — Thomas Skibinski
(74) *Attorney, Agent, or Firm* — Slater Matsil, LLP

(57) ABSTRACT

An embodiment latch device includes a first stage having circuitry that receives a differential input and generates a clocked data signal according to a clock signal and the differential input, and a second stage connected to the first stage and having circuitry that generates differential outputs according to the clock signal and the clocked data signal. The second stage further has a reset circuit that resets a latch storage to a high value according to the clock signal.

20 Claims, 3 Drawing Sheets

HIGH SPEED LATCH AND METHOD

TECHNICAL FIELD

The present invention relates generally to a digital comparator method, and, in particular embodiments, to a device and method for a two stage latch based comparator using a single clock phase with improved power usage and speed.

BACKGROUND

A latch is a circuit that has two stable states and can be used to store state information. The circuit can be made to change state by signals applied to one or more control inputs, and will have one or two outputs. It is the basic storage element in sequential logic, and is particularly useful as static random access memory (SRAM) because the latch tends to maintain the data while powered without requiring periodic refreshes like dynamic random access memory (DRAM). Latches are a fundamental building block of digital electronics systems used in computers, communications, and many other types of systems.

Latches are used as data storage elements. A flip-flop stores a single bit (binary digit) of data and one of its two states represents a "one" and the other represents a "zero". Such data storage can be used for storage of state, and such a circuit is described as sequential logic. A latch is level-sensitive, providing an output that is based on the polarity of the difference in inputs, permitting the latch to function as an analog to digital converter (ADC).

The comparison is the basic operation in an analog-to-digital converter (ADC). This operation is performed by the latched comparator, which works synchronously with the clock signal and indicates, through its digital output level, whether the differential input signal is positive or negative. A positive feedback mechanism regenerates the analog input signal into a full-scale digital level.

SUMMARY

An embodiment latch device includes a first stage having circuitry that receives a differential input and generates a clocked data signal according to a clock signal and the differential input, and a second stage connected to the first stage and having circuitry that generates differential outputs according to the clock signal and the clocked data signal. The second stage further has a reset circuit that resets a latch storage to a high value according to the clock signal.

An embodiment two stage latch circuit includes a differential stage disposed between a voltage source node and a ground node and having differential input ports, first clock input ports and clocked data signal output ports, and further includes a regeneration stage. The regeneration stage includes a latch storage connected at a first end to the voltage source node and having signal storage elements and output ports, a latch enable electrically connected between a second end of the latch storage and the ground node and the latch enable having a second clock input port, and a clocked input control connected between the output ports and the latch enable, the clocked input control having a clocked data signal input port connected to the clocked data signal output port, and a reset circuit connected to the latch storage and having third clock input ports.

An embodiment for storing data in a circuit includes receiving a differential input at a differential stage, generating, by the differential stage, clocked data signals according to a first portion of a clock signal cycle and the differential input, latching values into a latch storage of a regeneration stage according to the first portion of a clock signal cycle and according to the clocked data signals, providing differential output signals at output ports of the latch storage according to the first portion of a clock signal cycle and according to the latched values, and resetting the latch storage to a high value according to a second portion of the clock signal cycle.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Additionally, the methods and apparatuses described may be applied to a two stage comparator latch, but are not specifically limited to the same.

Modern computing devices rely on comparator latches for storing data in various forms, and for converting analog signals to digital signals. The large number of latches required for the increasing amount of data storage in modern computing devices results in data storage contributing significantly to power consumption and processing speed bottlenecks. Existing latches, such as the StrongArm latch, provide switching with relatively good power consumption, but are slow compared to other latches. This is, in part, due to the number of transistors required in the signal path in the StrongArm latch, and the associated capacitances introduced by the transistor gates. Additionally, the StrongArm latch has significant kickback, where the switching operations inside the latch feed through the capacitances back to the input, resulting in the latch introducing noise into the input signal.

The double-tail latch proposed by Schinkel is a two stage latch with separated input and cross-coupled storage stages, resulting in the Schinkel double-tail latch being faster than the StrongArm latch. However, the Schinkel double-tail latch requires a relatively high current, resulting in high power consumption, particularly when compared to the StrongArm latch.

Figure 1:
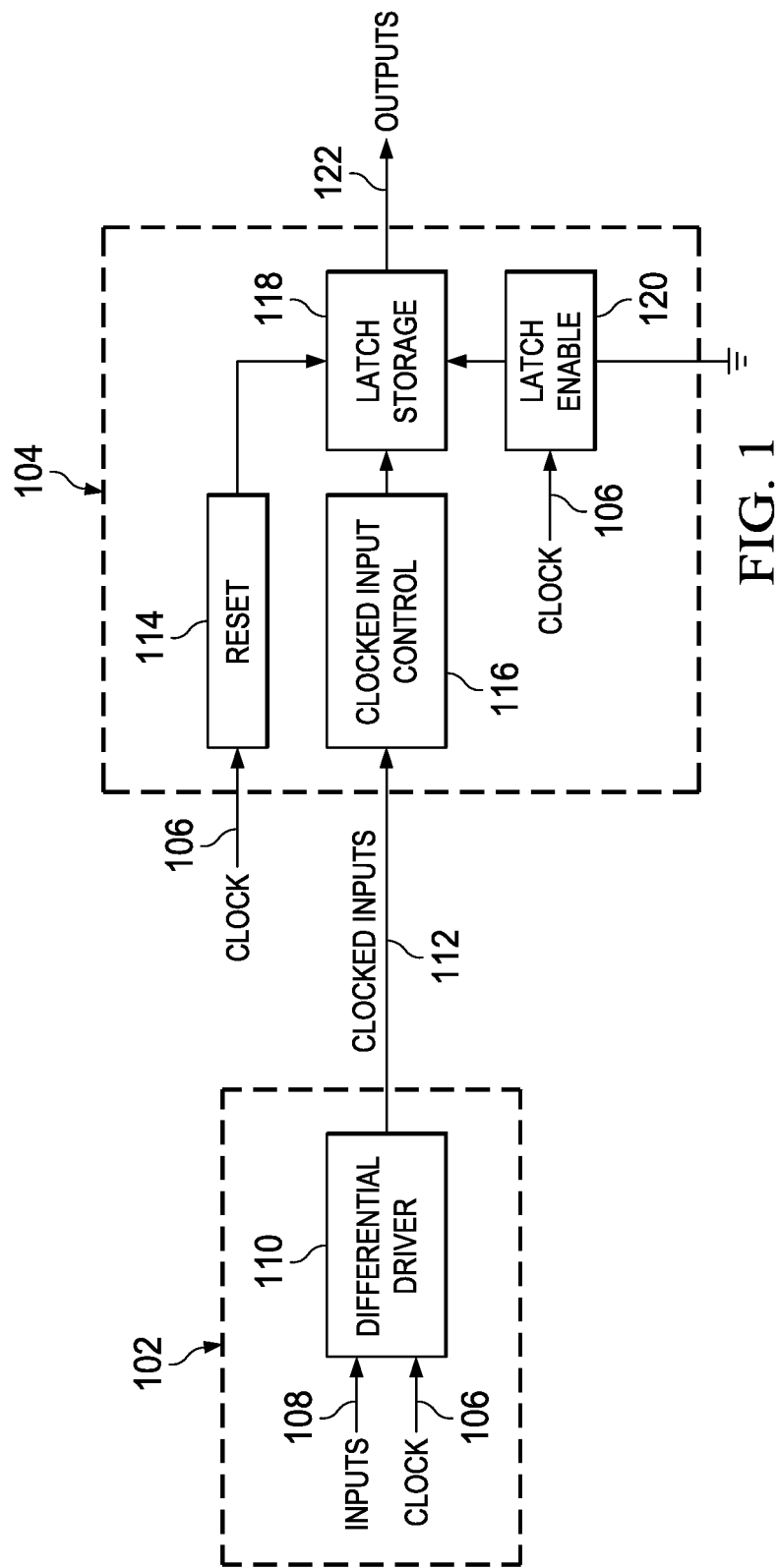
FIG. 1 is a logical diagram illustrating a two stage latch according to some embodiments.

FIG. 1 is a logical diagram illustrating a two stage latch according to some embodiments. Embodiments of the latch disclosed herein include a two stage latch having a differential stage 102 that provides clocked data signals 112 to a regeneration stage 104. The differential stage 102 has a differential driver 110 that receives differential inputs 108 at differential input ports and a clock signal 106 at clock input ports to generate the clocked data signals 112 at clocked data signal output ports.

The regeneration stage 104 has a latch storage 118 for latching and storing the clocked data signals 112 passed from the differential stage 102. Thus, the differential stage 102 converts an analog input, which indicates the difference in the differential inputs 108, or a digital input, into the clocked data signals 112 and sends the clocked data signals to the regeneration stage 104. The regeneration stage 104 stores the values of the clocked data signals 112 and provides the stored values as differential outputs 122 on output ports.

A reset circuit 114 is controlled by the clock signal 106 at a clock input port, and resets the latch storage 118 to a high signal between periods when the latch storage 118 stores the clocked data signals 112. Additionally, a latch enable 120 that is also controlled by the clock signal 106 at another clock input port is disposed between the latch storage 118 and a ground port to enable the latch storage 118. A clocked input control 116 is connected to the clocked data signal output ports and receives the clocked data signals 112 at clocked data signal input ports. The clocked input control 116 provides signals to the latch storage 118 to set the latch storage 118 data value. After the latch storage 118 receives the signals from the clocked input control 116, the latch storage 118 provides differential outputs 122 on the output ports. It has been determined that the reset circuit 114 holding or setting the latch storage 118 high for reset, combined with the latch enable 120 providing ground connectivity during operation, results in lower operating power. Additionally, the two stage arrangement provides increased speed and additional power savings due to the reduced clock loading.

The reset circuit 114 permits the use of a single clock signal 106 for all of the clock controlled inputs, avoiding the requirement that an inverted clock signal be provided. Thus, the latch storage 118 latches values according to the clocked data signal 112 in response to a first portion of the clock signal 106 cycle, and the reset circuit 114 resets the latch storage 118 high on a second portion of the clock signal 106 cycle.

Instead of using inverted clock signal to reset a regeneration stage of a two stage latch, where the normal clock signal goes low and the inverted clock signal goes high, using the same normal clock signal for the differential driver 110, the latch enable 120 and the reset circuit 114 permits the regeneration stage 104 to be reset much more quickly since the reset circuit 114 does not need to wait for the inverted clock signal to go high. Additionally, the two stage arrangement of the disclosed embodiments provides lower input signal loading since the gain of the latch is split between the differential stage 102 and the regeneration stage 104. This results in a device, when used, for example, with a summer in decision feedback equalization (DFE), that has improved bandwidth at the summer and reduced settling time at the output of the summer.

Furthermore, it has been determined that the disclosed two stage latch device embodiments operate at a lower supply voltage compared to the StrongArm latch. For example, the StrongArm latch tends to not operate at 0.83 v in the slow-slow (SS) process corners with lower than normal carrier mobilities in both the NFET and PFET devices, while the two stage latch works with lower power at such device parameters. In particular, the two stage latch device operation at lower supply voltages is apparent at the low voltages used in, for example, 28 nm and smaller processes, and at high data rates of 30 Gb/s and higher.

Figure 2:
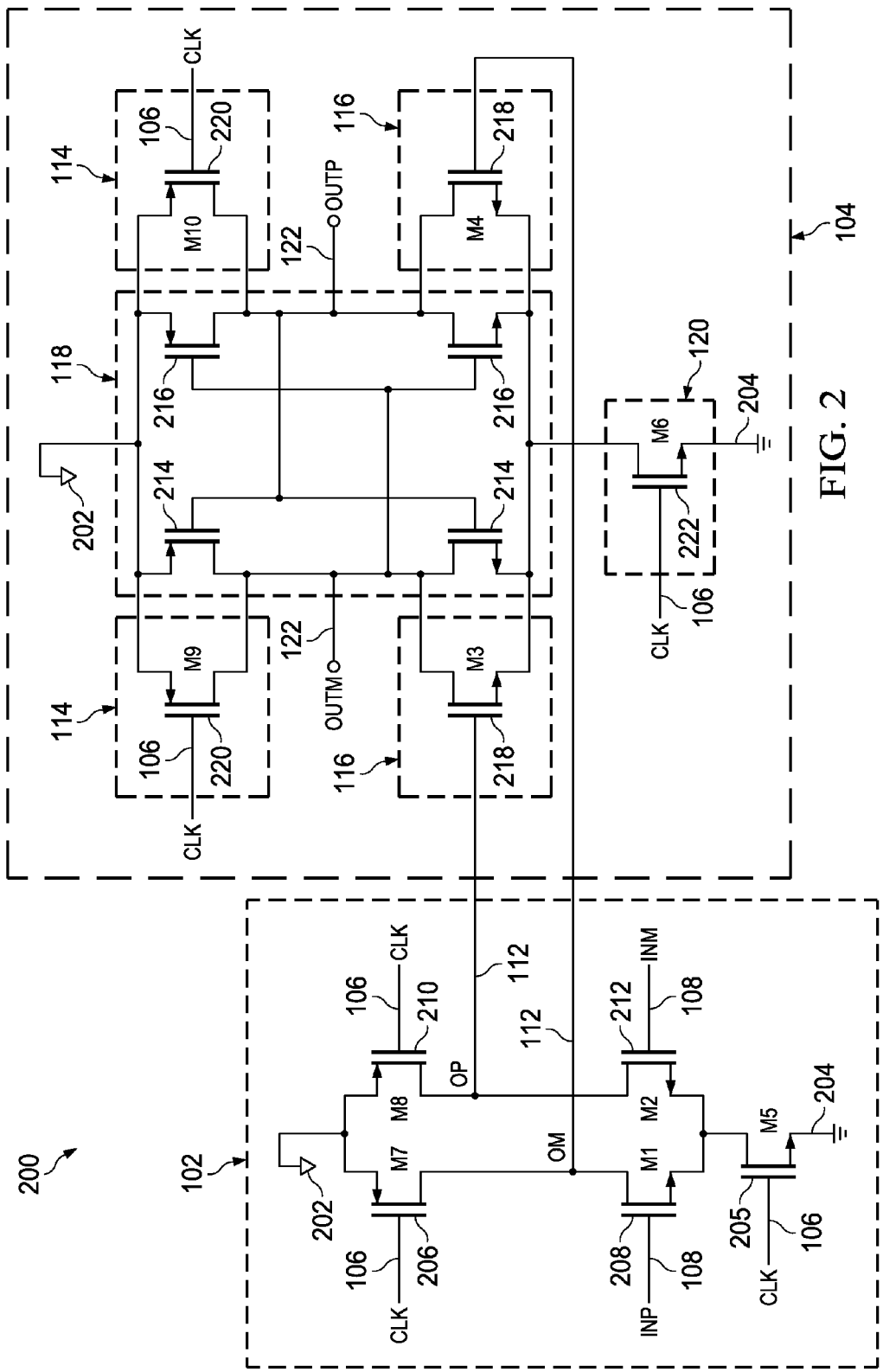
FIG. 2 is a circuit diagram illustrating a two stage latch according to some embodiments.

FIG. 2 is a circuit diagram illustrating a two stage latch 200 according to some embodiments. In some embodiments, the differential stage 102 has a differential driver that accepts differential inputs 108. Each of the differential inputs 108 controls the gates of respective transistors M1 208 and M2 212. A clock signal 106 controls transistors M7 206 and M8 210 which are each in series with transistors M1 208 and M2 212, and between the transistors M1 208 and M2 212 and a voltage source 202. The differential stage 102 is enabled by transistor M5 205. Notably, transistors M7 206 and M8 210 are a different conductivity type than transistors M1 208, M2 212 and M5 205.

In an embodiment, transistors M7 206 and M8 210 are PMOS transistors having a p-type conductivity, and transistors M1 208, M2 212 and M5 205 are NMOS transistors having an n-type conductivity. In such an embodiment, when the clock signal 106 is high, the transistors M7 206 and M8 210 are off, or non-conducting, and transistor M5 205 is on, or conducting. Therefore, when the clock signal 106 is high, the clocked data signal 112 associated with whichever input signal 108 is higher is discharged to ground faster than the clocked data signal 112 associated with the lower of the input signals 108. In this way, the first stage 102 amplifies the differential input 108. This is because the associated transistor M1 208 or M2 212 associated with the high input signal 108 when transistor M5 205 is on has a higher transconductance, which discharges the outputs 112 faster than the input signal 108 with lower input voltage. The transistors M1 208, M2 212 and M5 208 can be viewed as a pseudo-differential pair since transistor M5 208 is clocked rather than a current source. The clocked data signals 112 discharge at different rates depending on the differential voltage at the input signals 108 and because there are no resistors for load. This differential voltage is then passed as the clocked data signals 112 to the regeneration stage 104, which amplifies and latches the clocked data signals to create the outputs 122 as a rail-rail CMOS voltage that is independent of any further changes to the input signal 108 voltages. The clocked data signals 112 will eventually both discharge to 0 v, but have different discharge rates, and the regeneration stage 104 amplifies and latches the differential voltage before the clocked data signals 112 discharge. The regeneration stage 104 amplifies the differential voltage of the clocked data signals 112 and latches the voltage rail-to-rail in a single clocks cycle, and is triggered when the clock goes high.

When the clock signal is low, transistors M7 206 and M8 210 are on, or conducting, pulling the clocked data signals 112 high, regardless of the input signal values 108. This is commonly known as the reset state, as the clocked data signals 112 are reset high before the next comparison cycle. Transistor M5 205 is off, or non-conducting when the clock signal 106 is low, preventing an undefined or short condition through whichever of the transistors M1 208 or M2 212 that is on, or conducting, due to the associated high input signal 108.

In some embodiments, the regeneration stage 104 uses a bi-stable latching circuit as the latch storage 118, which may be a pair of cross-coupled inverters 214 and 216 connected between voltage source and the latch enable 120. In some embodiments, the latch enable 120 is an NMOS transistor M6 222 disposed between the latch storage 118 and ground 204. The latch enable transistor M6 222 is controlled by the clock signal 106 to be on, or conductive, when the clock signal 106 is high, enabling the latch storage 118 by providing a conductive path to ground 204 for the latch storage 118.

The regeneration stage 104 also has reset a reset circuit 114 that, in some embodiments, comprises PMOS transistors M9 220 and M10 220 that are connected between the voltage source 202 and the output nodes of respective ones of the inverters 214 and 216 of the latch storage 118. The reset circuit 114 receives the clock signal 106 and resets the output nodes high by connecting the output nodes to the voltage source 202 when the clock signal 106 is low. In some embodiments, the reset circuit 114 comprises PMOS transistors M9 and M10 220, which are on, or conducting, when the clock signal 106 is low. Thus, when the clock signal 106 is low, the output nodes are connected directly to the voltage source 202 and pulled high, and both inverters 214 and 216 are reset high. This occurs when the gates of the transistors of both inverters 214 and 216 set high, resetting the inverters 214 and 216 by turning off the PMOS transistor between the output node and the voltage source 202 and by turning on the NMOS transistor between the output node of the inverter and the latch enable 120. Since the latch enable 120 transistor M6 222 is off, the inverters 214 and 216 remain high.

In an embodiment, transistor M6 222 of the latch enable 120 has a conductivity type that is opposite of the transistors M9 and M10 220 of the reset circuit 114 so that transistor M6 222 has an on or off state that is opposite of transistors M9 and M10 220 at a particular clock signal 106 level. Such an arrangement causes the latch enable 120 to prevent the reset circuit 114 from shorting the voltage source 202 to ground 204 since transistors M9 and M10 220 and the transistors of the inverters 214 and 216 between the output node and the latch enable are both on, or conducting, during the reset phase when the clock signal 106 is low. Additionally, such an arrangement provides reset of the latch storage 118 during the low clock signal and using the same clock signal 106 for the latch enable 120 and the reset circuit 114. Thus, a separate and inverted clock signal may be avoided.

The regeneration stage 104 receives the clocked data signals 112 from the differential stage 102 at the clocked input control 116. In some embodiments, the clocked input control 116 comprises transistors M3 and M4 218 connected between the latch enable 120 and the output node of the inverters 214 and 216 of the latch storage 118. When the clock signal 106 is high, the transistors M3 and M4 218 amplify the differential voltage of the clocked data signals 112. When the clock signal 106 is high, the reset circuit 114 is off, permitting the clocked data signals 112 to control the inverter output nodes and the resulting outputs 122. When the clock signal 106 is low, the reset circuit 114 controls the inverter output nodes to connect the output nodes to the voltage source 202 and reset the inverters high.

When the clock signal 106 switches from low to high, the reset circuit 114 turns off, and the latch enable 120 turns on. The differential voltage of the clocked data signal 112 is amplified by M3 218 and M4 218 and the output of transistors M2 and M4 218 is transferred to, and latched by, latch storage 118. Since both clocked data signals 112 were high when the clock signal 106 was low, the NMOS transistors of the inverters 214 and 216 were off. A high clock signal 106 turns on the latch enable 120, permitting the output node associated with the non-zero clocked data signal 112 to discharge to ground faster than the output node associated with the low clocked data signal 112. The output nodes, being connected to the gates of the opposing inverter 214 and 216, latch the values at the output nodes until the clock signal 106 goes low again, resetting both output nodes and inverters high.

Thus, the regeneration stage 104 is reset high using the same clock phase as the differential stage 102, with both the differential stage 102 and regeneration stage 104 going into regeneration mode on the rising edge of the input signal 108.

The high reset and single clock reset cycle of the disclosed embodiments provides improved power usage over the Schinkel style double-tail latch. This is because the reset or PMOS transistors M9 and M10 220 in the pull-up path of the reset circuit 114 can be sized much smaller than in the Schinkel style double tail latch, preventing the PMOS transistors M9 and M10 220 from fighting against the NMOS transistors M1 208 and M2 212 of the differential stage 102 and causing a large current spike.

It should be noted that, while the two stage latch 200 is shown herein as being disposed between a voltage source 202 and a ground 204, the embodiments are not limited to such an arrangement, as the voltage source 202 and ground 204 may be set at any absolute voltages where the voltage of the voltage source 202 is positive in relation to, or higher than, the ground 204 voltage. For example, the voltage source 202 may be a positive voltage, such as 10 volts, and the ground may be any voltage that is lower than the voltage source 202, such as 5 volts. Thus, the voltage differential in such an example is 5 volts, and the ground simply refers to the lower potential. Similarly, the voltage source and ground may both be negative voltages when compared to a reference voltage, with the ground 204 being more negative than the voltage source 202.

Figure 3:
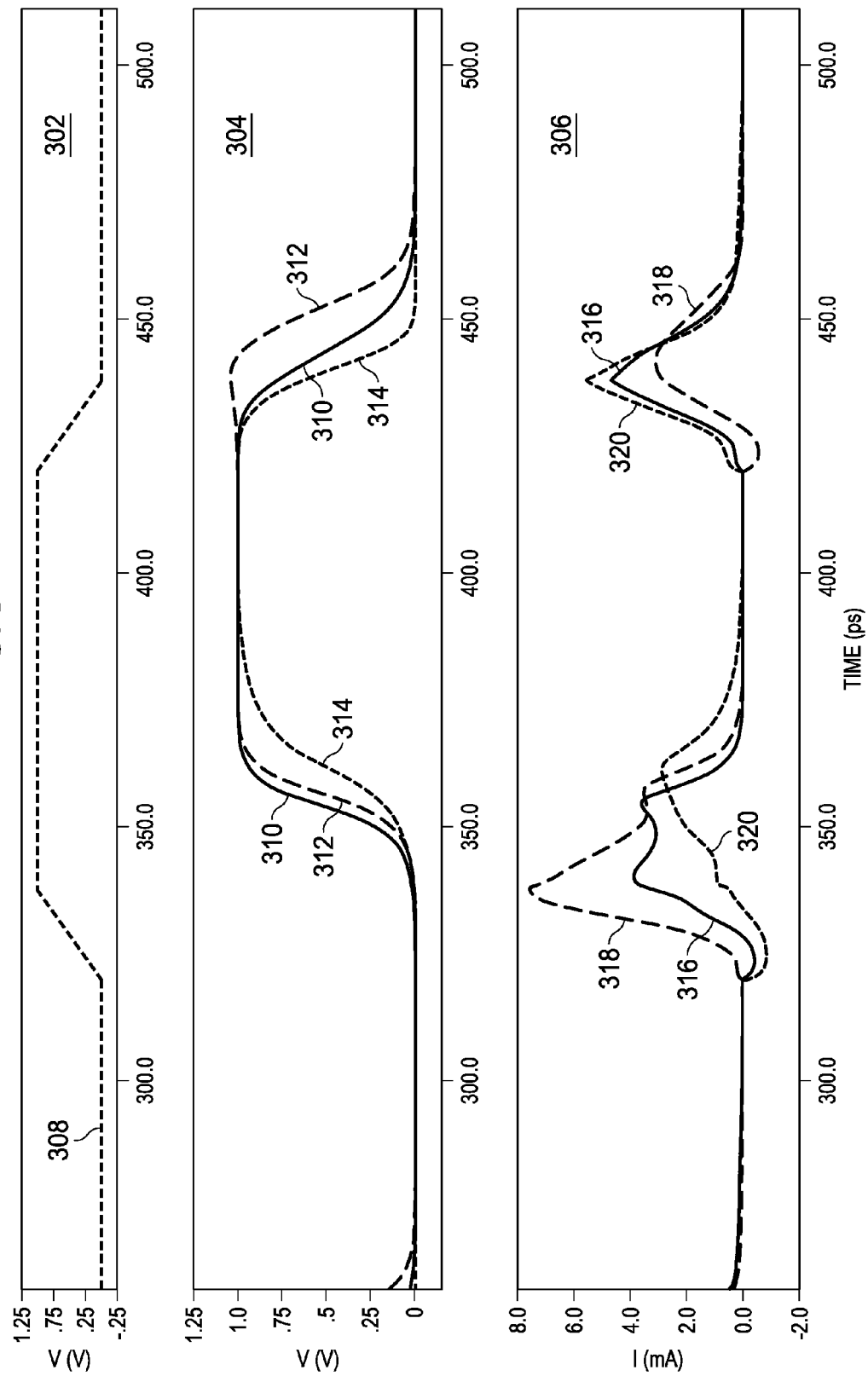
FIG. 3 is a chart illustrating output signals and current usage of the two stage latch according the various embodiments.

FIG. 3 is a chart illustrating output signals and current usage of the two stage latch according the various embodiments. FIG. 3 illustrates simulations of an input graph 302 showing a clock signal 308, an output graph 304 and a current graph 306. The input graph, 302, output graph 304 and current graph 306 are time aligned to illustrate the output and current responses in relation to the clock signal 308. The clock signal 308 illustrates a high clock pulse, with the clock signal 308 switching from a logical low to a logical high, and then back to a logical low.

The output graph 304 illustrates the two stage output signal 310, which is a simulated output of the two stage latch circuit shown in FIG. 2, compared to a Schinkel output signal 312 of a Schinkel style double tail latch and a StrongArm output signal 314 of a StrongArm latch. When the clock signal 308 goes high, comparison occurs, and when the clock signal 308 goes low, reset occurs. Notably, the two stage output signal 310 rises and stabilizes before the Schinkel output signal 312 and the StrongArm output signal 314. More specifically, the Schinkel style double-tail latch is slower than the two stage latch by about 27.5 ps, and StrongArm latch is slower than the two stage latch by about 32.9 ps. Generally, the delay of the reset is not critical, as long as the output signal settles before the next rising edge of the clock signal 308.

The time constant of the Schinkel style double-tail and two stage latch of FIG. 2 are comparable at about 4 ps, as the size of the regeneration stages are about the same. In contrast, the StrongArm time constant is about 6.8 ps. The time constant is an important parameter for data-converters, while the clock-to-q delay is critical in DFE designs as it directly affects the timing margin.

The current graph 306 illustrates the current draw of the two stage latch compared to the Schinkel style double-tail latch and the StrongArm latch. The two stage current signal 316 has an initial, turn-on current peak that is lower than the Schinkel current signal 318 and that is roughly the same as the StrongArm current signal 320. Additionally, the two stage current signal 316 has a current peak at reset that is roughly the same as the StrongArm current signal 320, and only slightly higher than the Schinkel current signal 318. Overall, the two stage latch has a power consumption that is lower than the Schinkel style double-tail latch and about the same as the StrongArm latch. However, the two stage latch is significantly faster than the StrongArm latch for the same power. Comparing the overall performance of the latches, the two stage latch has a delay*current of 21.08, the Schinkel style double-tail latch has a delay*current of 30.58, and the StrongArm latch has a delay*current of 25.85. The two stage latch also has a kickback, at 2.2 mv, that is about the same as the kickback of the Schinkel style double-tail latch at 2.02 mv and significantly lower than the kickback of the StrongArm latch at 13.45 mv.

Thus, an embodiment latch device comprises a first stage having circuitry that receives a differential input and generates a clocked data signal according to a clock signal and the differential input, and further comprises a second stage connected to the first stage and having circuitry that generates differential outputs according to the clock signal and the clocked data signal. The second stage further has a reset circuit that resets a latch storage to a high value according to the clock signal.

For example, a two stage latch circuit may have a first stage that is a differential stage that is disposed between a voltage source node and a ground node with differential input ports that receive the differential input, first clock input ports that receive a clock signal, and clocked data signal output ports that output the clocked data signal. The two stage latch circuit may also have a second stage that is a regeneration stage having a latch storage connected at a first end to the voltage source node, with the latch storage having signal storage elements and output ports. The regeneration state further has a latch enable electrically connected between a second end of the latch storage and the ground node, the latch enable having a second clock input port that receives the clock signal and enables the regeneration stage to latch the clocked data signal in the latch storage according to the clock signal and to output latched values as the differential output. The regeneration stage, or second stage, further has a clocked input control connected between the output ports and the latch enable, and has a clocked data signal input port connected to the clocked data signal output port. In some embodiments, the regeneration stage has a reset circuit connected to the latch storage, with the reset circuit having third clock input ports. The reset circuit may be connected between the voltage source node and to the latch storage at the output port to reset the latch storage to a high value according to the clock signal, such as when the clock signal is low.

In another example, an embodiment of method for storing data in a circuit such as a two stage latch may include receiving a differential input at a differential stage. In some embodiments, the differential input may be received at differential input ports. Clocked data signals are generated by the differential stage according to a first portion of a clock signal cycle and the differential input. Values are latched into a latch storage of a regeneration stage according to the first portion of a clock signal cycle and according to the clocked data signals. In some embodiments, the clocked data signals are output by the differential stage and received at the regeneration stage, or second stage. The regeneration stage, latches the clocked data signals in the latch storage when the first portion of the clock signal is high. Differential output signals are provided at output ports of the latch storage according to the first portion of a clock signal cycle and according to the latched values. In some embodiments, the latch storage provides the latched value on the output ports when the clock is high. The latch storage is reset to a high value according to a second portion of the clock signal cycle. In some embodiments, the latch storage is reset by a reset circuit when the clock signal is low.

An embodiment latch device includes a first stage having circuitry that receives a differential input and generates a clocked data signal according to a clock signal and the differential input, and a second stage connected to the first stage and having circuitry that generates differential outputs according to the clock signal and the clocked data signal. The second stage further has a reset circuit that resets a latch storage to a high value according to the clock signal.

In some embodiments, the reset circuit resets the latch storage to the high value when the clock signal has a low value. The second stage may further have a latch enable disposed between the latch storage and a ground, with the latch enable having circuitry that connects the latch storage to ground according to the clock signal. In some embodiments, the circuitry of the latch enable includes at least one first transistor having a first conductivity type, and the reset circuit includes at least one second transistor having a second conductivity type that is different from the first conductivity type. In some embodiments, the latch storage includes at least two inverters that are cross coupled, with each of the at least two inverters having at least two third transistors in series and an output port that is a node between the at least two third transistors of a respective one of the at least two inverters. In some embodiments, the reset circuit includes at least two second transistor that are connected between a voltage source and the output port of a respective one of the at least two inverters. In some embodiments, the second stage further has a clocked input control connected between the output ports and the latch enable, with the clocked input control having circuitry that accepts the clocked data signal and sets stored values in the latch storage according to the clocked data signal. In some embodiments, the circuitry of the first stage generates the clocked data signal at a high value when the clock signal is low, and wherein the circuitry of the first stage generates the clocked data signal according to the differential input when the clock signal is high.

An embodiment two stage latch circuit includes a differential stage disposed between a voltage source node and a ground node and having differential input ports, first clock input ports and clocked data signal output ports, and further includes a regeneration stage. The regeneration stage includes a latch storage connected at a first end to the voltage source node and having signal storage elements and output ports, a latch enable electrically connected between a second end of the latch storage and the ground node and the latch enable having a second clock input port, and a clocked input control connected between the output ports and the latch enable, the clocked input control having a clocked data signal input port connected to the clocked data signal output port, and a reset circuit connected to the latch storage and having third clock input ports.

In an embodiment, the reset circuit is connected between the voltage source node and the output port. In some embodiments, the latch enable includes at least one first transistor having a first conductivity type and the reset circuit includes second transistors having a second conductivity type that is different from the first conductivity type. In an embodiment, the second transistors of the reset circuit are connected between the voltage source node and respective ones of the output ports. In an embodiment, the second conductivity type is a p-type conductivity and the reset circuit resets the latch storage to a high value when a clock signal at the third clock input ports has a low value. In an embodiment, the clocked input control includes third transistors connected between the output ports and the latch enable with the third transistors having the first conductivity type. In an embodiment, the signal storage elements include at least a first inverter cross coupled with a second inverter, and outputs of the first inverter and second inverter are the output ports of the latch storage. In an embodiment, the first inverter and second inverter are configured to latch values according to the clocked data signals at the clocked data signal input ports and in response to the clock signal. In an embodiment, the differential stage includes fourth transistors that are each in series with a respective one of fifth transistors between the voltage source node and the ground node. The fifth transistors are each connected to respective ones of the differential input ports such that a clocked data signal is generated at the clocked data signal output ports according to a differential input signal at the differential input ports when a clock signal at the first clock input ports is high.

An embodiment for storing data in a circuit includes receiving a differential input at a differential stage, generating, by the differential stage, clocked data signals according to a first portion of a clock signal cycle and the differential input, latching values into a latch storage of a regeneration stage according to the first portion of a clock signal cycle and according to the clocked data signals, providing differential output signals at output ports of the latch storage according to the first portion of a clock signal cycle and according to the latched values, and resetting the latch storage to a high value according to a second portion of the clock signal cycle.

In an embodiment, the latching the values into the latch storage of the regeneration stage includes turning off a reset circuit during the first portion of the clock signal cycle, and turning on a latch enable circuit during the first portion of the clock signal cycle, and the latch enable circuit provides a ground signal to the latch storage when turned on. In an embodiment, the resetting the latch storage to a high value includes turning on a reset circuit during a second portion of the clock signal cycle, such that the reset circuit provides a voltage source signal to the output ports to set the latch storage to the high value, and turning off the latch enable circuit during the second portion of the clock signal cycle.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A latch device comprising:
   a first stage having circuitry that receives a differential input and generates a clocked data signal according to a clock signal and the differential input; and
   a second stage connected to the first stage and having circuitry that generates differential outputs according to the clock signal and the clocked data signal, the second stage further having a reset circuit that resets a latch storage to a high value according to the clock signal, wherein the clock signal causes the reset circuit to reset the latch storage and causes the first stage to reset in a same portion of a cycle of the clock signal.

2. The latch device of claim 1, wherein the reset circuit resets the latch storage to the high value when the clock signal has a low value.

3. The latch device of claim 2, the second stage further having a latch enable disposed between the latch storage and a ground, the latch enable having circuitry that connects the latch storage to ground according to the clock signal.

4. The latch device of claim 3, wherein the circuitry of the latch enable comprises at least one first transistor having a first conductivity type; and
   wherein the reset circuit comprises at least one second transistor having a second conductivity type that is different from the first conductivity type.

5. The latch device of claim 4, wherein the latch storage comprises at least two inverters that are cross coupled, each of the at least two inverters comprising at least two third transistors in series and an output port that is a node between the at least two third transistors of a respective one of the at least two inverters.

6. The latch device of claim 5, wherein the reset circuit comprises at least two second transistor that are connected between a voltage source and the output port of a respective one of the at least two inverters.

7. The latch device of claim 6, wherein the second stage further has a clocked input control connected between the output ports and the latch enable, the clocked input control having circuitry that accepts the clocked data signal and sets stored values in the latch storage according to the clocked data signal.

8. The latch device of claim 1, wherein the circuitry of the first stage generates the clocked data signal at a high value when the clock signal is low, and wherein the circuitry of the first stage generates the clocked data signal according to the differential input when the clock signal is high.

9. A two stage latch circuit comprising:
   a differential stage disposed between a voltage source node and a ground node and having differential input ports, first clock input ports and clocked data signal output ports; and
   a regeneration stage, comprising:
   a latch storage connected at a first end to the voltage source node and having signal storage elements and output ports;
   a latch enable electrically connected between a second end of the latch storage and the ground node, the latch enable having a second clock input port;
   a clocked input control connected between the output ports and the latch enable, and having a clocked data signal input port connected to the clocked data signal output port; and
   a reset circuit connected to the latch storage and having third clock input ports;
   wherein a first portion of a clock signal at the first clock input ports resets the differential stage, and wherein a same first portion of the clock signal causes the reset circuit to reset the latch storage.

10. The two stage latch circuit of claim 9, wherein the reset circuit is connected between the voltage source node and the output port.

11. The two stage latch circuit of claim 10, wherein the latch enable comprises at least one first transistor having a first conductivity type; and wherein the reset circuit comprises second transistors having a second conductivity type that is different from the first conductivity type.

12. The two stage latch circuit of claim 11, wherein the second transistors of the reset circuit are connected between the voltage source node and respective ones of the output ports.

13. The two stage latch circuit of claim 12, wherein the second conductivity type is a p-type conductivity such that the reset circuit resets the latch storage to a high value when a clock signal at the third clock input ports has a low value.

14. The two stage latch circuit of claim 12, wherein the clocked input control comprises third transistors connected between the output ports and the latch enable and having the first conductivity type.

15. The two stage latch circuit of claim 9, wherein the signal storage elements comprise at least a first inverter cross coupled with a second inverter, and wherein outputs of the first inverter and second inverter are the output ports of the latch storage.

16. The two stage latch circuit of claim 15, wherein the first inverter and second inverter are configured to latch values according to the clocked data signals at the clocked data signal input ports and in response to the clock signal.

17. The two stage latch circuit of claim 9, wherein the differential stage comprises fourth transistors that are each in series with a respective one of fifth transistors between the voltage source node and the ground node, and wherein the fifth transistors are each connected to respective ones of the differential input ports such that a clocked data signal is generated at the clocked data signal output ports according to a differential input signal at the differential input ports when a clock signal at the first clock input ports is high.

18. A method for storing data in a circuit, comprising:
receiving a differential input at a differential stage;
generating, by the differential stage, clocked data signals according to a first portion of a clock signal cycle and the differential input;
latching values into a latch storage of a regeneration stage according to the first portion of a clock signal cycle and according to the clocked data signals;
providing differential output signals at output ports of the latch storage according to the first portion of a clock signal cycle and according to the latched values; and
resetting the latch storage to a high value according to a second portion of the clock signal cycle and resetting the differential stage at a same second portion of the clock cycle.

19. The method of claim 18, wherein the latching the values into the latch storage of the regeneration stage comprises:
turning off a reset circuit during the first portion of the clock signal cycle; and
turning on a latch enable circuit during the first portion of the clock signal cycle, wherein the latch enable circuit provides a ground signal to the latch storage when turned on.

20. The method of claim 18, wherein the resetting the latch storage to a high value comprises:
turning on a reset circuit during the second portion of the clock signal cycle, wherein the reset circuit provides a voltage source signal to the output ports to set the latch storage to the high value; and
turning off a latch enable circuit during the second portion of the clock signal cycle.

* * * * *